(12) United States Patent
Zhu (10) Patent No.: US 12,470,020 B2
(45) Date of Patent: Nov. 11, 2025

(54) SERVER CABINET, AND CABLE PLUG MISTAKEN REMOVAL PREVENTION MECHANISM THEREOF

(71) Applicant: INSPUR SUZHOU INTELLIGENT TECHNOLOGY CO., LTD., Jiangsu (CN)

(72) Inventor: Changle Zhu, Jiangsu (CN)

(73) Assignee: INSPUR SUZHOU INTELLIGENT TECHNOLOGY CO., LTD., Jiangsu (CN)

( * ) Notice: Subject to any disclaimer, the term of this patent is extended or adjusted under 35 U.S.C. 154(b) by 297 days.

(21) Appl. No.: 18/022,984

(22) PCT Filed: Nov. 30, 2021

(86) PCT No.: PCT/CN2021/134332
§ 371 (c)(1),
(2) Date: Feb. 23, 2023

(87) PCT Pub. No.: WO2022/156375
PCT Pub. Date: Jul. 28, 2022

(65) Prior Publication Data
US 2024/0014601 A1   Jan. 11, 2024

(30) Foreign Application Priority Data

Jan. 22, 2021 (CN) .......................... 202110089192.8

(51) Int. Cl.
*H05K 7/14* (2006.01)
*H01R 13/639* (2006.01)

(52) U.S. Cl.
CPC ......... *H01R 13/639* (2013.01); *H05K 7/1491* (2013.01)

(58) Field of Classification Search
CPC .............. H01R 13/639; H01R 13/6392; H05K 7/1491; H05K 5/0247
See application file for complete search history.

(56) References Cited

U.S. PATENT DOCUMENTS 6,676,417 B1 * 1/2004 Wilson ................... H01R 12/79
439/364
7,134,902 B1 * 11/2006 Lewis ................ H01R 13/6395
439/372

(Continued)

FOREIGN PATENT DOCUMENTS

CN     203660381 U     6/2014
CN     204067696 U     12/2014

(Continued)

OTHER PUBLICATIONS

PCT/CN2021/134332 international search report.

*Primary Examiner* — Jacob R Crum
(74) *Attorney, Agent, or Firm* — IPro, PLLC (57) ABSTRACT

Disclosed is a mechanism for preventing mistaken removal of cable plug, including: a sliding frame slidably arranged in a cabinet body along an inserting and pulling direction of a cable; swing rods rotatably connected to the sliding frame; and abutting parts arranged at tail ends of the swing rods and for abutting against an end face of the cable plug, wherein the sliding frame is further detachably provided with a locking member for connecting with the cabinet body to lock the abutting part. According to the mechanism for preventing mistaken removal of cable plug, the abutting portion stably abuts against the end surface of the cable plug such that, when a connecting cable is pulled by mistake by an external pulling force, the cable plug may be prevented from being pulled out and removed from a server interface.

20 Claims, 4 Drawing Sheets

(56) References Cited

U.S. PATENT DOCUMENTS

| | | | |
|---|---|---|---|
| 7,513,791 B1* | 4/2009 | Gary | H01R 13/6395 |
| | | | 439/373 |
| 2002/0127902 A1 | 9/2002 | Momiyama | |
| 2015/0049573 A1* | 2/2015 | Calange | B01F 35/3204 |
| | | | 439/577 |

FOREIGN PATENT DOCUMENTS

| | | |
|---|---|---|
| CN | 111600177 A | 8/2020 |
| CN | 112928542 A | 6/2021 |

\* cited by examiner

SERVER CABINET, AND CABLE PLUG MISTAKEN REMOVAL PREVENTION MECHANISM THEREOF

CROSS-REFERENCE TO RELATED APPLICATION

The present disclosure claims the priority of the Chinese patent application filed on Jan. 22, 2021 before the CNIPA, China National Intellectual Property Administration with the application number of 202110089192.8 and the title of "SERVER CABINET, AND CABLE PLUG MISTAKEN REMOVAL PREVENTION MECHANISM THEREOF", which is incorporated herein in its entirety by reference.

FIELD

The disclosure relates to the technical field of server, in particular to a mechanism for preventing mistaken removal of cable plug, and the disclosure further relates to a server cabinet using the same.

BACKGROUND

With development of electronic technology, more and more electronic equipment has been widely used.

Servers are important parts of electronic equipment, which provides computing services. Since the servers need to respond to and process service requests, generally speaking, the servers should have the ability to undertake and guarantee services. According to different types of services provided by the servers, the servers may be classified into file servers, database servers, application servers, WEB servers, and so on. Main components of a server include processor, hard disk, memory, system bus, and so on, like a general computer architecture.

In the age of big data, a large number of IT equipment will be centralized and placed in data centers. These data centers contain various types of servers, storage, switches and a large number of cabinets and other infrastructure. Each IT equipment is composed of various hardware boards, for example computing module, storage module, chassis, fan module, and so on, in order to improve integrated installation density of servers in the data centers, servers are usually installed through server cabinets.

The server cabinet is used to assemble and install panel, plug-in ware, plug-in box, electronic components, devices and mechanical parts and components, to form an integrated installation. The overall server cabinet is composed of a frame and a mask plate (door panel), which generally has a rectangular shape and is placed on the floor, to provide an appropriate environment and safety protection for normal operation of servers and other electronic equipment, and so on.

At present, respective servers in a server cabinet mainly adopt connecting cables to realize signal communicating, or connect with signal interaction equipment. To facilitate signal connection, it only needs inserting cable plugs of connecting cables into corresponding server interfaces. However, in the prior art, after servers are placed and installed in server cabinets, the cable plugs inserted in the server data connection ports are easy to be pulled by operators carelessly when carrying out operations of maintenance, assembly or disassembly, thus causing the cable plugs to loosen and fall off from the server interfaces, leading to interruption of signal connection and affecting normal operation of the server cabinets.

SUMMARY

The purpose of the disclosure is to provide a mechanism for preventing mistaken removal of cable plug, which may prevent a circumstance that the cable plug is mistakenly touched to cause looseness and ensure stable and continuous signal communication of the servers. Another purpose of the disclosure is to provide a server cabinet.

To solve the above technical problem, the disclosure provides a mechanism for preventing mistaken removal of cable plug, including: a sliding frame slidably arranged in a cabinet body along an inserting and pulling direction of a cable; swing rods rotatably connected to the sliding frame; and abutting parts arranged at tail ends of the swing rods and for abutting against an end face of the cable plug, wherein the sliding frame is further detachably provided with a locking member for connecting with the cabinet body to lock the abutting part.

In an embodiment of the disclosure, outer walls of both sides of the sliding frame are provided with sliding blocks, wherein the sliding blocks respectively extend along the inserting and pulling direction of the cable and for cooperating with chutes opened on inner walls of both sides of the cabinet body to slide.

In an embodiment of the disclosure, an outer end wall of the sliding frame is provided with a first handle for driving the sliding frame to slide, wherein both sides of the first handle are provided with locking plates for connecting with an inner wall of the cabinet body, and the locking member detachably penetrates through ends of the locking plate.

In an embodiment of the disclosure, a number of the swing rods provided in the sliding frame is two, wherein a head end of one of the swing rods is rotatably connected with an inner top wall of the sliding frame, and makes the corresponding abutting part abut against an upper part of the end face of the cable plug, a head end of another one of the swing rods is rotatably connected with an inner bottom wall of the sliding frame and makes the corresponding abutting part abut against an lower part of the end face of the cable plug.

In an embodiment of the disclosure, an outer surface of the abutting part is sleeved with an elastic sleeve, and the abutting part is rotatably connected to the tail end of the swing rod.

In an embodiment of the disclosure, reset springs are respectively connected both between the inner top wall of the sliding frame and the corresponding swing rod and between the inner bottom wall of the sliding frame and the corresponding swing rod, the reset springs are respectively penetrated by arc-shaped guide rod whose curvatures respectively match swing tracks of the swing rods, head ends of the arc-shaped guide rods are respectively connected with the inner top wall and inner bottom wall of the sliding frame, and tail ends of the arc-shaped guide rods respectively penetrate through the corresponding swing rods and are prevented from falling out of the swing rods through connected retainer rings.

In an embodiment of the disclosure, inner ends wall of the sliding frame are respectively connected with extension rods, ends of the extension rods are respectively provided with pulleys, the pulleys are respectively provided with tension ropes, both an outer top wall and an outer bottom wall of the sliding frame are respectively slidably provided with driving slide plates, one ends of the respective tension ropes are connected with the corresponding driving slide plates, and another ends of the respective tension ropes are connected with the corresponding swing rods.

In an embodiment of the disclosure, a number of connecting plates are connected between the driving slide plates in a vertical direction, and the respectively connecting plates are connected by a second handle being distributed in a horizontal direction.

The disclosure further provides a server cabinet, including a cabinet body and a mechanism for preventing mistaken removal of cable plug arranged in the cabinet body, wherein the cabinet body and the mechanism for preventing mistaken removal of cable plug are the cabinet body and the mechanism for preventing mistaken removal of cable plug described in any of the above items.

In an embodiment of the disclosure, a number of mounting plates for installing servers are distributed in the cabinet body in a vertical direction, surfaces of the respective mounting plates are provided with masks, surfaces of the respective masks are opened by ventilation holes for ventilating bottoms of the servers, and one ends of the respective masks are connected and communicated with a fan installed on the cabinet body through a ventilation pipe.

The disclosure further provides a method for manufacturing a server cabinet, and the method includes providing the above cabinet body and the above mechanism for preventing mistaken removal of cable plug arranged in the cabinet body.

BRIEF DESCRIPTION OF THE DRAWINGS

In order to more clearly illustrate the technical solutions in the embodiments of the disclosure or in the prior art, the following will briefly introduce the drawings needed to be used in illustrating the embodiments or the prior art. Apparently, the drawings in the following description are only embodiments of the disclosure. For those ordinary skilled in the field, they may further obtain other drawings according to the provided drawings without paying creative labor.

In FIG. 1-FIG. 4:
Cable plug—a, Server—b;
Cabinet body—1, Sliding frame—2, Swing rod—3, Abutting part—4, Locking member—5, First handle—6, Locking plate—7, Elastic sleeve—8, Reset spring—9, Arc-shaped guide rod—10, Retainer ring—11, Extension rod—12, Pulley—13, Tension rope—14, Driving slide plate—15, Connecting plate—16, Second handle—17, Mounting plate—18, Mask—19, Ventilation pipe—20, Fan—21, T-shaped sliding block—22, T-shaped chute—23;
Chute—101, Heat dissipation hole—102, Sliding block—201, Ventilation hole—191.

DETAILED DESCRIPTION OF THE EMBODIMENTS

The technical solutions in the embodiments of the disclosure will be described clearly and completely below in combination with the drawings in the embodiments of the disclosure. Apparently, the described embodiments are only part of the embodiments of the disclosure, not all of them. Based on the embodiments in the disclosure, all other embodiments obtained by those ordinary skilled in the art without paying creative work belong to the scope of protection in the disclosure.

It is a technical problem faced by those skilled in the art how to prevent cable plugs from being mistakenly touched to cause looseness and ensure stable and continuous signal communication of the servers.

Figure 1:
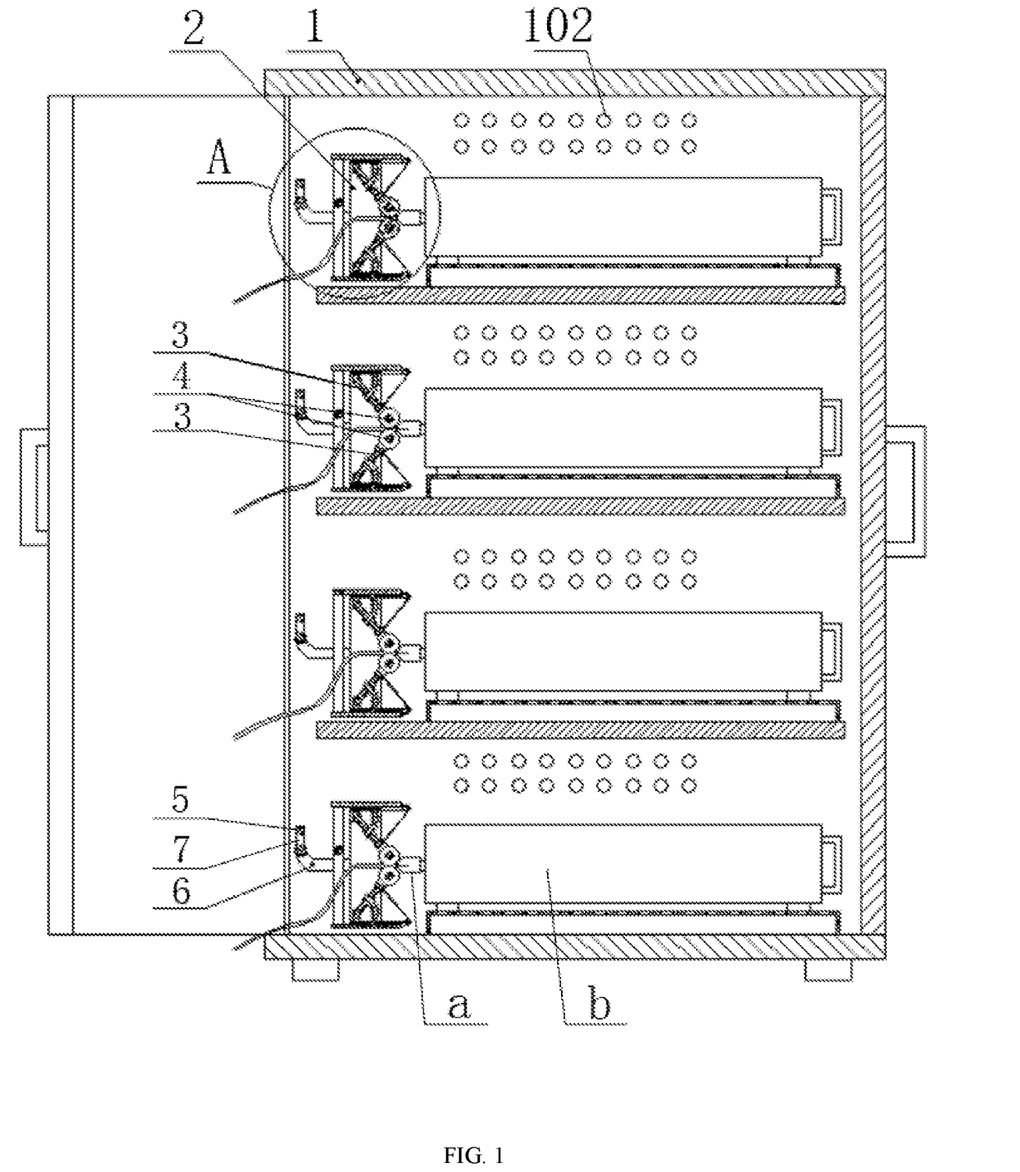
FIG. 1 is a schematic view of an overall structure of an embodiment provided in the disclosure.

Please refer to FIG. 1, FIG. 1 is a schematic view of an overall structure of an embodiment provided in the disclosure.

In an embodiment provided in the disclosure, the mechanism for preventing mistaken removal of cable plug, mainly includes a sliding frame 2, swing rods 3, abutting parts 4 and a locking member 5.

Among them, the sliding frame 2 is a main body structure of the mechanism, which is mainly used for installing other parts, and may slide in a reciprocating manner in the cabinet body 1 along a fixed direction, and the sliding direction thereof is actually an inserting and pulling direction of a cable plug a in an interface of a corresponding server b in the cabinet body 1 that is, a connecting cable of the cable plug a (generally a certain straight-line direction in a horizontal plane).

The swing rod 3 is arranged in the sliding frame 2, a head end of the swing rod 3 is rotatably connected with the sliding frame 2, and the swing rod 3 may swing in a reciprocating manner by a certain amplitude in the sliding frame 2.

The abutting part 4 is arranged at a tail end of the swing rod 3, the abutting part 4 is mainly used for swinging with swinging of the swing rod 3 to press wire harness of a connecting cable, and further sliding with the sliding frame 2 in the cabinet body 1 and sliding along the wire harness to form abutting against an end face of the cable plug a.

The locking member 5 is arranged on the sliding frame 2 and may be easily assembled and disassembled. The locking member 5 is mainly used for forming connection with the cabinet body 1 to fix the sliding frame 2 at a current sliding position, so as to lock the abutting part 4 at a current position to maintain stable abutting against the end face of the cable plug a.

In this way, through the mechanism for preventing mistaken removal of cable plug provided in the embodiment, the end face of the cable plug a is stably abutted by the abutting part 4. When the connecting cable is mistakenly pulled by an external pulling force, it may prevent the cable plug a from being pulled out and falling off from the interface of the server b through an abutting action of the abutting part 4 on the end face of the cable plug a and a locking action of the locking part 5 on the abutting part 4, so as to ensure stable and continuous signal communication of the server b. Meanwhile, after detaching the locking member 5, moving the sliding frame 2 in an opposite direction, it may make the end face of the cable plug a separate from the abutting part 4, so as to realize normal removal of the cable plug a on the interface of the server b.

Figure 3:
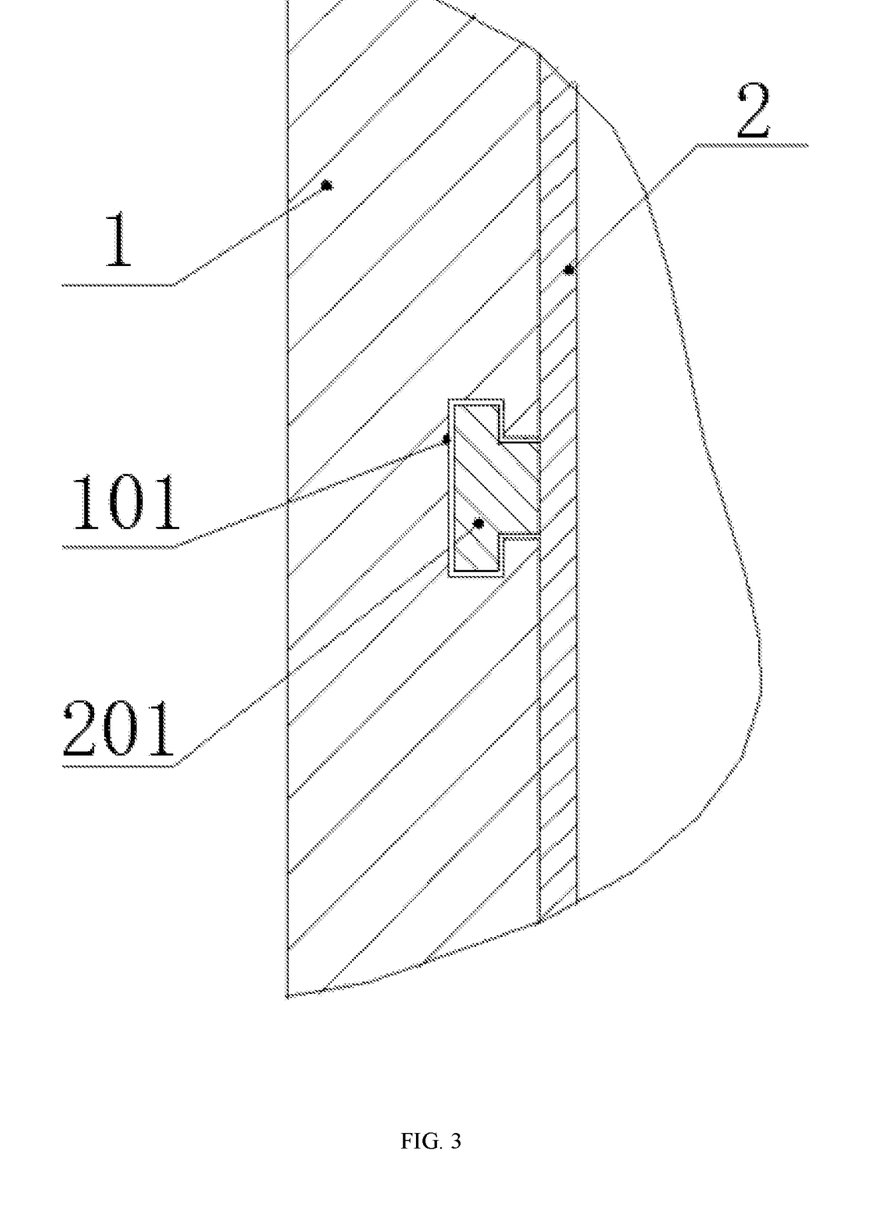
FIG. 3 is a schematic view of a connection structure between a sliding frame and a cabinet body.

As shown in FIG. 3, FIG. 3 is a schematic view of a connection structure between a sliding frame and a cabinet body.

In an embodiment related to the sliding frame 2, in order to facilitate sliding of the sliding frame 2 in the cabinet body 1 in the fixed direction, outer walls of both sides of the sliding frame 2 are provided with sliding blocks 201 in the embodiment. Correspondingly, inner walls of both sides of the cabinet body 1 are provided with the chutes 101 in the embodiment, so that the chutes 101 are able to cooperate with the corresponding sliding blocks 201 to provide a movement guidance action for a sliding movement of the sliding frame 2. For example, since the direction of inserting and pulling action of the cable plug a in the interface of the server b is generally a horizontal direction, the sliding blocks 201 set on the sliding frame 2 extend along the direction of inserting and pulling of the cable plug a, i.e., along a certain straight-line direction in the horizontal plane.

Further, in order to facilitate pushing the sliding frame 2 to perform a reciprocating sliding movement in the cabinet body 1, in the embodiment, a first handle 6 is arranged on an outer end wall of the sliding frame 2 (facing a cabinet door of the cabinet body 1 is an outer side, and facing inside of the cabinet body 1 is an inner side). An operator may drive the sliding frame 2 to perform a reciprocating straight-line movement by pushing or pulling the first handle 6, and then drive the abutting part 4 at the tail end of the swing rod 3 to perform a synchronous reciprocating movement, so as to realize abutting and disconnection between the abutting part 4 and the end face of cable plug a.

Furthermore, in order to lock the abutting part 4 at an abutting position through the locking member 5, in the embodiment, positions of both sides of the first handle 6 are provided with locking plates 7. For example, one end of the locking plate 7 is connected to a surface of the first handle 6, and another end of the locking plate 7 is used for connecting with an inner wall of the cabinet body 1. The locking member 5 penetrates through the another end of the locking plate 7, and may connect the locking plate 7 with the cabinet body 1. Generally, the locking member 5 may be a fastener for example a locking bolt, and so on, which may be easily screwed, assembled and disassembled on the locking plate 7. The inner wall of the cabinet body 1 may be provided with a corresponding thread hole to cooperate with the locking member 5. In this way, when the another end of the locking plate 7 is connected with the inner wall of the cabinet body 1 and locked by the locking member 5, the first handle 6 and the sliding frame 2 may not perform a sliding movement, and for the same reason, the abutting part 4 may not perform the sliding movement either, so that the abutting part 4 is stably kept in the abutting position. Even if the cable plug a is suffered an external pulling force, an abutting action force formed by the cable plug a on the abutting part 4 is transmitted along directions of rod bodies of the swing rods 3, forming a self-locking state on the swing rods 3, so that the cable plug a may not overcome an abutting action of the abutting part 4 to make the swing rod 3 swing, and thus may not be removed.

Figure 2:
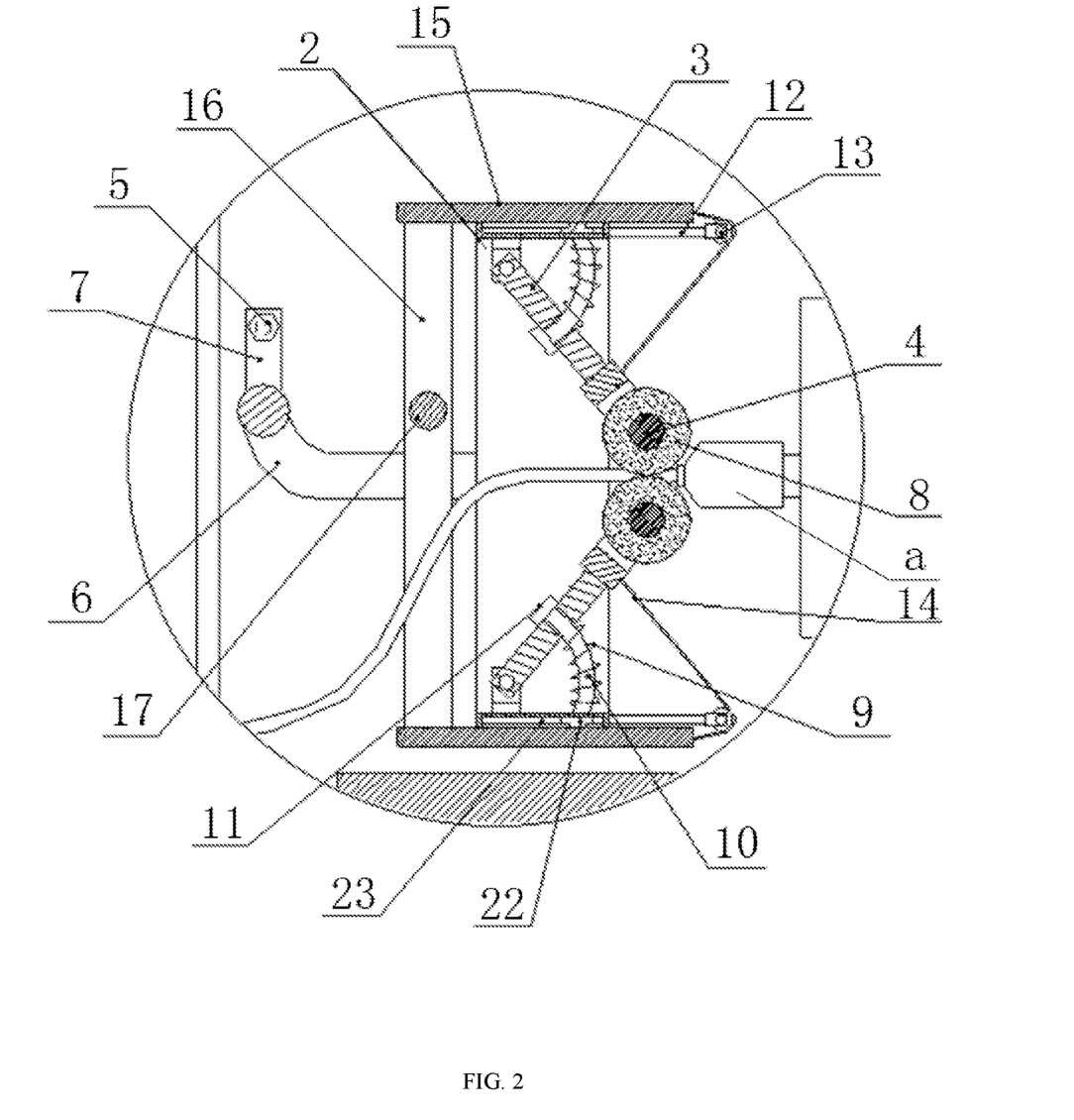
FIG. 2 is an enlarged view of a structure at A shown in FIG. 1.

As shown in FIG. 2, FIG. 2 is an enlarged view of a structure at circle A shown in FIG. 1.

In an embodiment related to the swing rod 3, in order to improve a press action on the wire harness of the connecting cable, and at the same time improve the abutting action force on the cable plug a and stability, in the embodiment, the mechanism is provided two swing rod 3 simultaneously.

Among them, one swing rod 3 is arranged in an upper part of the sliding frame 2 (which may be called an upper swing rod 3), and another swing rod 3 is arranged in a lower part of the sliding frame 2 (which may be called a lower swing rod 3). The two swing rods 3 form an axisymmetric distribution with the horizontal plane between them as a symmetry plane. For example, the head end of the upper swing rod 3 forms a rotational connection with an inner top wall of the sliding frame 2, and the abutting part 4 connected to the tail end of the upper swing rod 3 is used for abutting against an upper part of an end of the cable plug a. For the same reason, the head end of the lower swing rod 3 forms a rotational connection with an inner bottom wall of the sliding frame 2, and the abutting part 4 connected at the tail end of the lower swing rod 3 is used for abutting against a lower part of the end of the cable plug a. In this way, the upper swing rod 3 and the lower swing rod 3 simultaneously clamp the wire harness of the connecting cable in upper and lower directions, and simultaneously respectively abut on the upper and lower parts of the end face of the cable plug a, so that the locking action on the cable plug a is stronger and more stable.

In order to prevent the wire harness of the connecting cable or the end face of the cable plug a from being damaged by the abutting part 4 under the abutting action, in the embodiment, an elastic sleeve 8, for example a rubber sleeve, a polyurethane sleeve, an so on, is sleeved on an outer surface of the abutting part 4. At the same time, considering that before the abutting part 4 forms abutting against the end face of the cable plug a, the abutting part 4 often needs to slide a small distance on the wire harness under sliding drive of the sliding frame 2 (and then the abutting part 4 may abut the end face of the cable plug a), in the embodiment, the abutting part 4 may further perform free rotation at the tail end of the swing rod 3 to form rolling friction on a surface of the wire harness when sliding with the sliding frame 2, so as to reduce friction and wear. For example, the abutting part 4 may be a component of a roller shaft, and so on, and may penetrate through the tail end of the swing rod 3 through a component of a pin shaft, and so on. The tail end of the swing rod 3 may further be provided with a U-shaped piece to cooperate with the pin shaft. For the same reason, the head end of the swing rod 3 may also be rotatably connected with the inner top wall or inner bottom wall of the sliding frame 2 through a cooperating structure of a U-shaped part and a pin shaft.

In addition, considering that, during inserting and pulling operations of the cable plug a, the swing rod 3 needs to swing in a corresponding direction so as to make inserting and pulling room for the cable plug a, in the embodiment, a reset spring 9 is provided to enable the swing rod 3 to automatically reset to an initial position after swinging. For example, one end of the reset spring 9 is connected to the inner top wall or inner bottom wall of the sliding frame 2, and another end of the reset spring 9 is correspondingly connected to the upper swing rod 3 or the lower swing rod 3, which is equivalent to that an overall of the reset spring 9 is distributed between the swing rods 3 and the sliding frame 2. In this way, after the upper swing rod 3 swings upward and the lower swing rod 3 swings downward, the inserting and pulling room for the cable plug a is made, and during this process, the reset springs 9 are compressed by the swing rods 3 so as to accumulate elastic potential energy. After the swing of the swing rods 3 is completed, under actions of elastic forces of the reset springs 9, the upper swing rod 3 swings downward to reset and the lower swing rod 3 swings upward to reset, so that it is restored to clamp the wire harness of the connecting cable or abut the end of the cable plug a.

Further, considering that the reset spring 9 needs to conform to a rotary movement of the swing rod 3 to perform an elastic expansion or contraction, in the embodiment, an arc-shaped guide rod 10 penetrates through the reset spring 9, and a radian of the arc-shaped guide rod 10 matches a swing track of the corresponding swing rod 3. In this way, the reset spring 9 is equivalent to being sleeved on the arc-shaped guide rod 10. When compressed by the swing rod 3, the reset spring 9 will perform an elastic contraction movement along the arc-shaped guide rod 10. The same is true for an elastic extension of the reset spring 9. At the same time, a head end of the arc-shaped guide rod 10 is connected to the inner top wall or inner bottom wall of the sliding frame 2, and a tail end of the arc-shaped guide rod 10 penetrates through the corresponding swing rod 3, so that the swing rod 3 is penetrated by the arc-shaped guide rod 10, then when the swing rod 3 swings, the swing rod 3 may swing along a curvature of the arc-shaped guide rod 10.

In order to prevent the swing rod 3 from falling out of the arc-shaped guide rod 10 during swing, in the embodiment, the tail end of the arc-shaped guide rod 10 is further provided with a retainer ring 11. For example, the retainer ring 11 abuts against a surface of the swing rod 3, and a diameter of the retainer ring 11 is larger than a diameter of a through hole opened on the swing rod 3 for the arc-shaped guide rod 10 to penetrate through.

In order to facilitate an operator to drive the swing rod 3 to swing in a reciprocating manner, to realize normal inserting and pulling operations of the cable plug a, in the embodiment, a drive component is further provided. For example, the drive assembly mainly includes an extension rod 12, a pulley 13, a tension rope 14 and a driving slide plate 15.

Among them, the extension rods 12 are arranged on inner end walls of the sliding frame 2. The extension rods 12 may be generally arranged on upper and lower sides of the sliding frame 2 simultaneously. For example, the extension rod 12 may be connected with the sliding frame 2 by welding, and has a certain length. At the same time, the driving slide plates 15 may be arranged on an outer top wall and an outer bottom wall of the sliding frame 2, and may respectively slide in a reciprocating manner on the outer top wall and the outer bottom wall of the sliding frame 2. A sliding direction of the driving slide plates 15 is the same as that of the sliding frame 2, which is the inserting and pulling direction of the cable plug a, and generally is a straight-line movement direction in the horizontal plane. One end of the tension rope 14 is connected with an end of the corresponding driving slide plate 15, and another end of the tension rope 14 is connected with the corresponding swing rod 3. In this way, when the driving slide plate 15 slides on the sliding frame 2, the driving slide plate 15 will drive the tension rope 14 to tighten and pull the tension rope 14 or loosen the tension rope 14, through an action of the pulley 13.

For example, when the driving slide plates 15 slide on the sliding frame 2 toward an outer side of the cabinet body 1, the tension ropes 14 will be pulled to make the upper swing rod 3 swing up and the lower swing rod 3 swing down, thus making the two swing rods 3 open to each other to make inserting and pulling room for the cable plug a. On the contrary, when the driving slide plates 15 slide on the sliding frame 2 toward an inner side of the cabinet body 1, the tension ropes 14 will be loosened, and under actions of the reset springs 9, the upper swing rod 3 swings downward and the lower swing rod 3 swings upward, thus making the two swing rods 3 close to each other, to re-clamp the wire harness or form abutting against the end face of the cable plug a.

Further, considering that, when driving the swing rods 3 to swing, it is necessary to drive the upper and lower driving slide plates 15 to slide synchronously, for this reason, in the embodiment, a number of connecting plates 16 are connected between the two driving slide plates 15. For example, the respective connecting plates 16 may be distributed between the two driving slide plates 15 in a vertical direction, and at the same time, the respective connecting blocks are connected with each other through a second handle 17. With such setting, an operator may realize simultaneous sliding movements of the upper and lower driving slide plates 15 by pushing and pulling operations on the second handle 17. The second handle 17 may be horizontally distributed to facilitate grasping and applying force.

In addition, in order to ensure that the sliding movement of the driving slide plates 15 on the sliding frame 2 is stable and smooth, the same as a sliding structure between the sliding frame 2 and the cabinet body 1, in the embodiment, the respective driving slide plates 15 may be provided with T-shaped sliding blocks 22. Accordingly, T-shaped chutes 23 may be correspondingly arranged on the sliding frame 2, so that the T-shaped sliding blocks 22 may slide in the T-shaped chutes 23, thereby providing a guiding action for the sliding movement of the driving slide plates 15 on the sliding frame 2.

The embodiment further provides a server cabinet, which mainly includes the cabinet body 1 and the mechanism for preventing mistaken removal of cable plug a set in the cabinet body 1, wherein the specific contents of the mechanism for preventing mistaken removal of cable plug a are the same as the above related content, and will not be repeated here.

Figure 4:
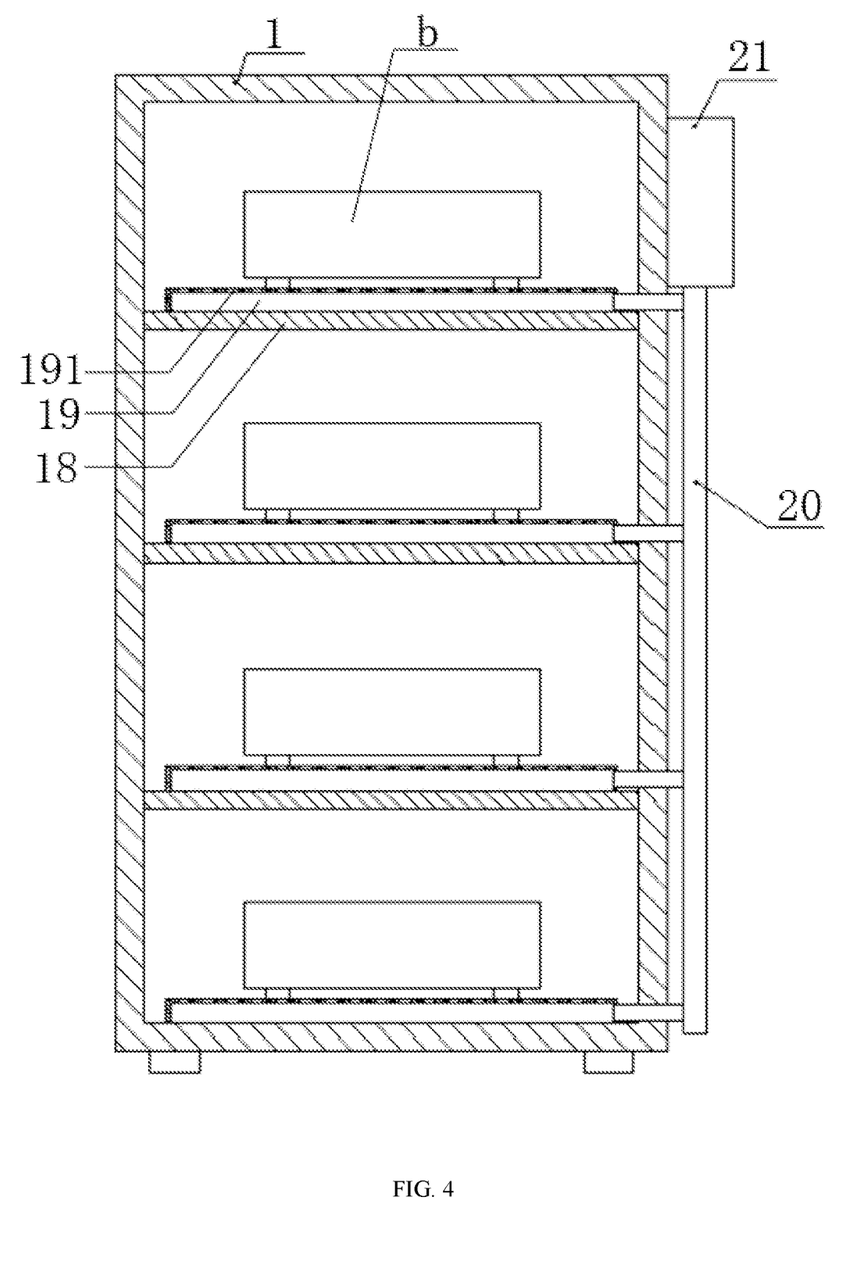
FIG. 4 is a schematic view of FIG. 1 from another view angle.

As shown in FIG. 4, FIG. 4 is a schematic view of FIG. 1 from another view angle.

In addition, considering that a plurality of servers b are installed in a cabinet of the servers b at the same time, resulting in large operating heat, in order to improve heat dissipation efficiency, in the embodiment, a plurality of mounting plates 18 and a plurality of masks 19 are arranged in the cabinet body 1. For example, the respective mounting plates 18 are distributed in a plurality of layers in the cabinet body 1 in the vertical direction. Surfaces of the respective mounting plates 18 are provided with the masks 19, and surfaces of the respective masks 19 are used for installing the servers b. At the same time, a fan 21 is installed on an outer wall of the cabinet body 1. An air outlet of the fan 21 extends into the cabinet body 1 through a ventilation pipe 20, and is connected and communicated with inside of the masks 19 on the mounting plates 18 in the respective layers. A number of ventilation holes 191 are opened on the surfaces of the respective masks 19, and the respective ventilation holes 191 face bottoms of the respective servers b. Therefore, when the fan 21 is running, cold air may be blown into the respective masks 19 through the ventilation pipe 20, and blown to the bottoms of the respective servers b through the ventilation holes 191 to cool the servers b.

For the same reasons, in the embodiment, a number of heat dissipation holes 102 are opened on walls of both sides of the cabinet body 1 to realize convection heat dissipation through heat exchange with external cold air.

The embodiment further provides a method for manufacturing a server cabinet, and the method includes providing the above cabinet body 1 and the above mechanism for preventing mistaken removal of cable plug arranged in the cabinet body 1.

The mechanism for preventing mistaken removal of cable plug provided in the disclosure mainly includes a sliding frame, swing rods, abutting parts and a locking member. Among them, the sliding frame is a main structure of the mechanism, which is mainly used to install other parts and components, and may slide in a reciprocating manner in the cabinet along a fixed direction. The sliding direction thereof is actually the sliding direction is actually an inserting and pulling direction of a cable plug in an interface of a corresponding server in the cabinet body (generally a certain straight-line direction in a horizontal plane). The swing rod is arranged in the sliding frame, a head end of the swing rod is rotatably connected with the sliding frame, and the swing rod may swing in a reciprocating manner by a certain amplitude in the sliding frame. The abutting part is arranged at a tail end of the swing rod, the abutting part is mainly used for swinging with swinging of the swing rod to press wire harness of a connecting cable, and further sliding with the sliding frame in the cabinet body and sliding along the wire harness to form abutting against an end face of the cable plug. The locking member is arranged on the sliding frame and may be easily assembled and disassembled. The locking member is mainly used for forming connection with the cabinet body to fix the sliding frame at a current sliding position, so as to lock the abutting part at a current position to maintain stable abutting against the end face of the cable plug. In this way, through the mechanism for preventing mistaken removal of cable plug provided in the embodiment, the end face of the cable plug is stably abutted by the abutting part. When the connecting cable is mistakenly pulled by an external pulling force, it may prevent the cable plug from being pulled out and falling off from the interface of the server through an abutting action of the abutting part on the end face of the cable plug and a locking action of the locking part on the abutting part, so as to ensure stable and continuous signal communication of the server. Meanwhile, after detaching the locking member, moving the sliding frame in an opposite direction, it may make the end face of the cable plug separate from the abutting part, so as to realize normal removal of the cable plug on the interface of the server.

The above description of the disclosed embodiments enables those skilled in the art to realize or use the application. A variety of modifications to these embodiments will be apparent to those skilled in the art. The general principles defined herein may be implemented in other embodiments without departing from the spirit or scope of the disclosure. Therefore, the disclosure will not be limited to the embodiments shown herein, but should conform to the widest scope consistent with the principles and novel features disclosed herein.

The invention claimed is:

1. A mechanism for preventing mistaken removal of cable plug, comprising: a sliding frame slidably arranged in a cabinet body along an inserting and pulling direction of a cable; swing rods rotatably connected to the sliding frame; and abutting parts arranged at tail ends of the swing rods and for abutting against an end face of the cable plug, wherein the sliding frame is further detachably provided with a locking member for connecting with the cabinet body to lock the abutting part.

2. The mechanism for preventing mistaken removal of cable plug according to claim 1, wherein outer walls of both sides of the sliding frame are provided with sliding blocks, wherein the sliding blocks respectively extend along the inserting and pulling direction of the cable and for cooperating with chutes opened on inner walls of both sides of the cabinet body to slide.

3. The mechanism for preventing mistaken removal of cable plug according to claim 2, wherein an outer end wall of the sliding frame is provided with a first handle for driving the sliding frame to slide, wherein both sides of the first handle are provided with locking plates for connecting with an inner wall of the cabinet body, and the locking member detachably penetrates through ends of the locking plate.

4. The mechanism for preventing mistaken removal of cable plug according to claim 1, wherein a number of the swing rods provided in the sliding frame is two, wherein a head end of one of the swing rods is rotatably connected with an inner top wall of the sliding frame, and makes the corresponding abutting part abut against an upper part of the end face of the cable plug, a head end of another one of the swing rods is rotatably connected with an inner bottom wall of the sliding frame, and makes the corresponding abutting part abut against an lower part of the end face of the cable plug.

5. The mechanism for preventing mistaken removal of cable plug according to claim 4, wherein an outer surface of the abutting part is sleeved with an elastic sleeve, and the abutting part is rotatably connected to the tail end of the swing rod.

6. The mechanism for preventing mistaken removal of cable plug according to claim 5, wherein reset springs are respectively connected both between the inner top wall of the sliding frame and the corresponding swing rod and between the inner bottom wall of the sliding frame and the corresponding swing rod, the reset springs are respectively penetrated by arc-shaped guide rod whose curvatures respectively match swing tracks of the swing rods, head ends of the arc-shaped guide rods are respectively connected with the inner top wall and inner bottom wall of the sliding frame, and tail ends of the arc-shaped guide rods respectively penetrate through the corresponding swing rods and are prevented from falling out of the swing rods through connected retainer rings.

7. The mechanism for preventing mistaken removal of cable plug according to claim 6, wherein inner ends wall of the sliding frame are respectively connected with extension rods, ends of the extension rods are respectively provided with pulleys, the pulleys are respectively provided with tension ropes, both an outer top wall and an outer bottom wall of the sliding frame are respectively slidably provided with driving slide plates, one ends of the respective tension ropes are connected with the corresponding driving slide plates, and another ends of the respective tension ropes are connected with the corresponding swing rods.

8. The mechanism for preventing mistaken removal of cable plug according to claim 7, wherein a number of connecting plates are connected between the driving slide plates in a vertical direction, and the respectively connecting plates are connected by a second handle being distributed in a horizontal direction.

9. A server cabinet, comprising a cabinet body and a mechanism for preventing mistaken removal of cable plug arranged in the cabinet body, wherein the cabinet body and the mechanism for preventing mistaken removal of cable plug are according to claim 1.

10. The server cabinet according to claim 9, wherein a number of mounting plates for installing servers are distributed in the cabinet body in a vertical direction, surfaces of the respective mounting plates are provided with masks, surfaces of the respective masks are opened by ventilation holes for ventilating bottoms of the servers, and one ends of the respective masks are connected and communicated with a fan installed on the cabinet body through a ventilation pipe.

11. The mechanism for preventing mistaken removal of cable plug according to claim 1, wherein head ends of the respective swing rods are respectively rotatably connected with the sliding frame.

12. The mechanism for preventing mistaken removal of cable plug according to claim 1, wherein, in response to that a connecting cable is mistakenly pulled by an external pulling force, an abutting action of the abutting parts on the end face of the cable plug and a locking action of the locking part on the abutting parts prevent the cable plug from being pulled out and falling off from a interface of a server, and in response to detaching the locking member and moving the sliding frame in an opposite direction, the end face of the cable plug separates from the abutting parts to remove the cable plug on the interface of the server.

13. The mechanism for preventing mistaken removal of cable plug according to claim 3, wherein one ends of the locking plates are respectively connected to surfaces of the first handle, another ends of the locking plates are used for connecting with the inner wall of the cabinet body, and the locking member penetrates through the another ends of the locking plates to connect the locking plates with the cabinet body.

14. The mechanism for preventing mistaken removal of cable plug according to claim 5, wherein the elastic sleeve comprises a rubber sleeve or a polyurethane sleeve.

15. The mechanism for preventing mistaken removal of cable plug according to claim 6, wherein, in response to that the swing rods respectively swing upward and downward, a inserting and pulling room for the cable plug is made, and the reset springs are respectively compressed by the swing rods to accumulate elastic potential energy, and in response to that swing of the swing rods is completed, under actions of elastic forces of the reset springs, the swing rods respectively reset to clamp wire harness of a connecting cable or abut the end of the cable plug.

16. The mechanism for preventing mistaken removal of cable plug according to claim 7, wherein the driving slide plates are able to respectively slide in a reciprocating manner on the outer top wall and the outer bottom wall of the sliding frame, and a sliding direction of the driving slide plates is a same as that of the sliding frame.

17. The mechanism for preventing mistaken removal of cable plug according to claim 7, wherein, in response to that the driving slide plates slide on the sliding frame, the driving slide plates respectively drive the tension ropes to tighten and pull the tension ropes or loosen the tension ropes, through an action of the pulley.

18. The mechanism for preventing mistaken removal of cable plug according to claim 7, wherein, in response to that the driving slide plates slide on the sliding frame toward an outer side of the cabinet body, the tension ropes are respectively pulled to make the swing rods respectively swing to a make inserting and pulling room for the cable plug, and in response to the driving slide plates slide on the sliding frame toward an inner side of the cabinet body, the tension ropes are respectively loosened, and under actions of the reset springs, the swing rods respectively swing to making the two swing rods close to each other to re-clamp wire harness of a connecting cable or form abutting against the end face of the cable plug.

19. The mechanism for preventing mistaken removal of cable plug according to claim 7, wherein the respective driving slide plates are respectively provided with T-shaped sliding blocks, and T-shaped chutes are correspondingly arranged on the sliding frame, so that the T-shaped sliding blocks are able to slide in the T-shaped chutes.

20. A method for manufacturing a server cabinet, comprising:
providing a cabinet body and a mechanism for preventing mistaken removal of cable plug arranged in the cabinet body, wherein the cabinet body and the mechanism for preventing mistaken removal of cable plug are according to claim 1.

* * * * *